(12) United States Patent
Yokoyama et al.

(10) Patent No.: US 6,953,600 B2
(45) Date of Patent: Oct. 11, 2005

(54) CONDUCTIVE FILM FORMING COMPOSITION, CONDUCTIVE FILM, AND METHOD FOR FORMING THE SAME

(75) Inventors: Yasuaki Yokoyama, Tokyo (JP); Yasuo Matsuki, Tokyo (JP); Ikuo Sakono, Osaka (JP); Kazuki Kobayashi, Osaka (JP); Yasumasa Takeuchi, Kawasaki (JP)

(73) Assignees: JSR Corporation, Toyko (JP); Sharp Corporation, Osaka (JP); International Center for Materials Research, Kawasaki (JP)

( * ) Notice: Subject to any disclaimer, the term of this patent is extended or adjusted under 35 U.S.C. 154(b) by 285 days.

(21) Appl. No.: 10/410,154

(22) Filed: Apr. 10, 2003

(65) Prior Publication Data

US 2003/0224152 A1 Dec. 4, 2003

(30) Foreign Application Priority Data

Apr. 19, 2002 (JP) ........................................ 2002-118381
Jul. 19, 2002 (JP) ........................................ 2002-211236

(51) Int. Cl.⁷ ............................................... B05D 5/12
(52) U.S. Cl. ...................... 427/123; 427/97.1; 427/553; 427/558
(58) Field of Search ....................... 252/521.5; 427/553, 427/558, 256, 307, 97.1, 123

(56) References Cited

FOREIGN PATENT DOCUMENTS

DE          1212817       *    3/1966
GB          2248853       *    4/1992

OTHER PUBLICATIONS

Baum et al "Laser–induced chemical vapor deposition of aluminum", Appl. Phys. Lett. 55(12) Sep. 1989 pp 1264–1266.*

J. K. Ruff, et al., J. Amer. Chem. Soc., vol. 82, pp. 2141–2144, "The Amine Complexes of Aluminum Hydride. I.", May 5, 1960.

G. W. Fraser, et al., J. Amer. Chem. Soc., pp. 3742–3749, "Aluminum Hydride Adducts of Trimethylamine: Vibrational Spectra and Structure", 1963.

J. L. Atwood, et al., J. Amer. Chem. Soc., vol. 113, pp. 8183–8185, "Tertiary Amine Stabilized Dialane", 1991.

* cited by examiner

*Primary Examiner*—Mark Kopec
(74) *Attorney, Agent, or Firm*—Oblon, Spivak, McClelland, Maier & Neustadt, P.C.

(57) ABSTRACT

There are provided a conductive film forming composition capable of forming wiring or an electrode which can be suitably used in a variety of electronic devices, easily and inexpensively, a method for forming a film using the composition, a conductive film formed by the method, and wiring or an electrode which comprises the film.

A conductive film forming composition comprising a complex of an amine compound and aluminum hydride and an organic solvent is applied on a substrate and then subjected to a heat treatment and/or irradiation with light, whereby a conductive film such as an electrode or wiring is produced.

4 Claims, 2 Drawing Sheets

CONDUCTIVE FILM FORMING COMPOSITION, CONDUCTIVE FILM, AND METHOD FOR FORMING THE SAME

BACKGROUND OF THE INVENTION (i) Field of the Invention

The present invention relates to a conductive film forming composition, a conductive film using the composition, and a method for forming the composition. More specifically, it relates to a conductive film forming composition which can be suitably used in formation of wiring of an electronic device, a method for forming the composition, and a film formed by the method such as wiring or an electrode.

(ii) Description of the Prior Art

Aluminum is used as a material of wiring used in a solar cell, a semiconductor device, and a variety of electronic devices such as an electronic display device. Heretofore, it has generally been practiced that such an aluminum film is formed by a vacuum process such as sputtering, vacuum deposition or chemical vapor deposition (CVD) and the obtained aluminum film is formed into an aluminum pattern by photoetching using a resist. However, since this method requires a large-scale vacuum deposition device, it is disadvantageous in terms of energy consumption. In addition, since it is difficult with the method to form uniform aluminum wiring on a large-area substrate, it causes a low yield and high costs.

Meanwhile, a paste having fine aluminum particles dispersed in a binder has been developed in recent years, and a method of forming an aluminum pattern by screen-printing the paste so as to form a pattern and baking the pattern has been reported. Since this method is direct patterning by printing of the aluminum paste, it can be carried out at low costs. However, since obtained aluminum contains impurities, it is difficult to obtain an aluminum pattern with low resistance, and it is technically difficult to form a fine pattern by use of the method.

SUMMARY OF THE INVENTION

Therefore, an object of the present invention is to provide a conductive film forming composition capable of forming wiring or an electrode which can be suitably used in a variety of electronic devices, easily and inexpensively; a method of forming a film using the composition; a conductive film formed by the method; and wiring or an electrode composed of the film.

Other objects and advantages of the present invention will be apparent from the following description.

According to the present invention, firstly, the above objects and advantages are achieved by a conductive film forming composition comprising a complex of an amine compound and aluminum hydride and an organic solvent.

According to the present invention, secondly, the above objects and advantages are achieved by a method for forming a conductive film which comprises the steps of applying the above conductive film forming composition of the present invention on a substrate and then subjecting the applied composition to heating and/or irradiation of light.

According to the present invention, thirdly, the above objects and advantages are achieved by a conductive film obtained by the above method of the present invention.

According to the present invention, fourthly, the above objects and advantages of the present invention are achieved by a method for forming a patterned conductive film which comprises the steps of applying the above conductive film forming composition of the present invention on a substrate having hydrophilic portions and hydrophobic portions patterned on the surface so as to form a pattern-like coating film and then subjecting the film to heating and/or irradiation of light.

According to the present invention, fifthly, the above objects and advantages are achieved by wiring or an electrode obtained by the above method of the present invention.

BREIF DESCRIPTION OF THE DRAWINGS

DETAILED DESCRIPTION OF THE PREFERED EMBODIMENT

Figure 1:
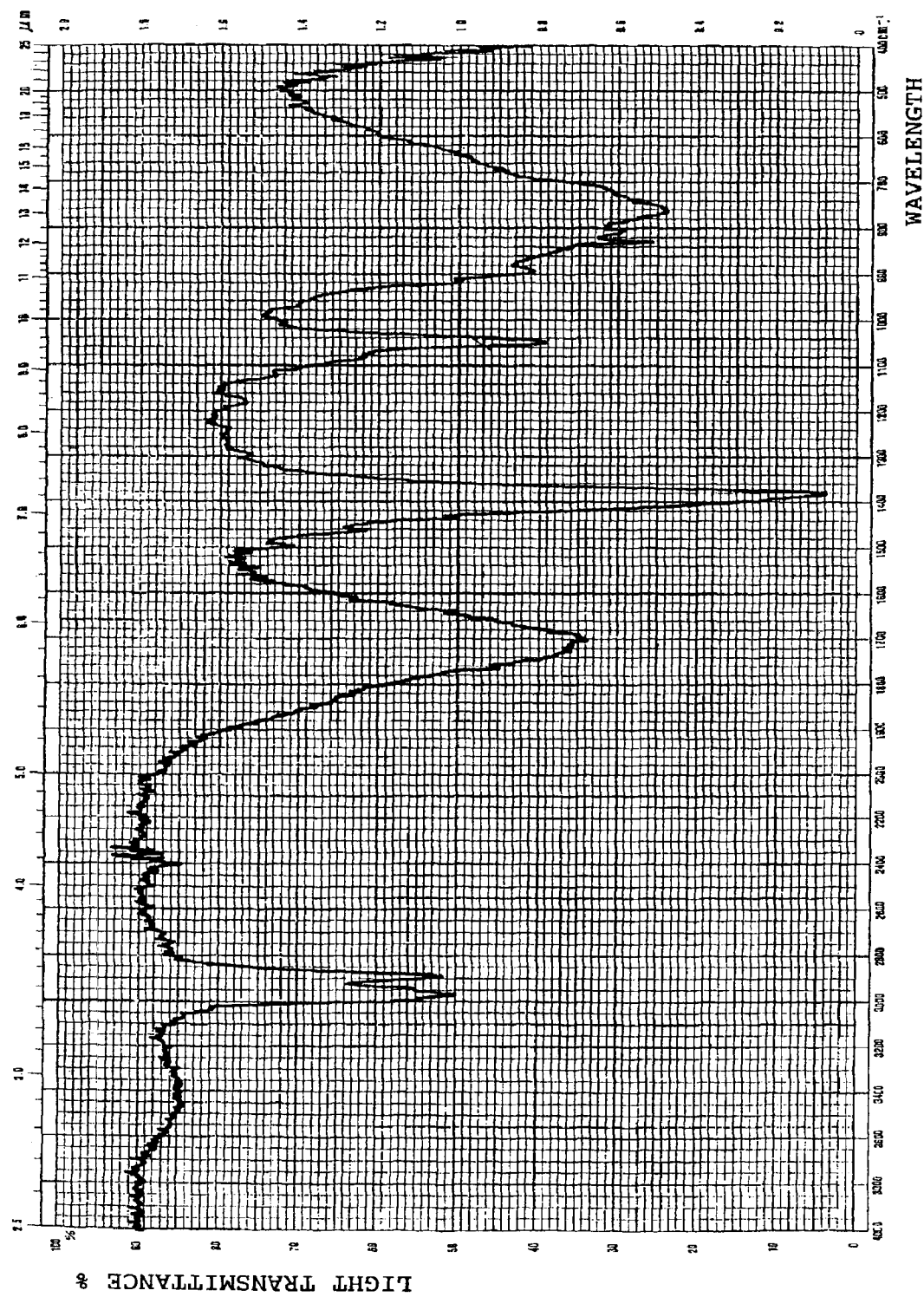
FIG. 1 is a diagram of an IR spectrum of an alane-amine complex used in Examples.

Hereinafter, the present invention will be described in more detail.

A conductive film forming composition of the present invention contains a complex of an amine compound and aluminum hydride and an organic solvent. Aluminum hydride (also often referred to by its conventional name "alane") is a compound comprising aluminum and hydrogen atoms and is believed to have a rational formula which is generally represented by $AlH_3$.

The complex of an amine compound and alane which is used in the conductive film forming composition of the present invention can be synthesized in accordance with methods described in, for example, J. K. Ruff et al., J. Amer. Chem. Soc., Vol. 82, p. 2,141, 1960; G. W. Fraser et al., J. Chem. Soc., p. 3,742, 1963; J. L. Atwood et al., J. Amer. Chem. Soc., Vol. 113, p. 8,183, 1991.

The amine compound constituting the complex in the conductive film forming composition of the present invention may be a monoamine compound or a polyamine compound such as a diamine or a triamine. As the monoamine compound, a compound represented by the following formula (1) can be suitably used, for example.

$$R^1R^2R^3N \qquad (1)$$

wherein $R^1$, $R^2$ and $R^3$ are each independently a hydrogen atom, an alkyl group having 1 to 12 carbon atoms, an alkenyl group, an alkynyl group, a cyclic alkyl group or an aryl group.

Specific examples of $R^1$, $R^2$ and $R^3$ in the formula (1) include hydrogen; alkyl groups such as methyl, ethyl, propyl, butyl, pentyl, hexyl, heptyl, octyl, nonyl, decyl, undecyl and dodecyl groups; alkenyl groups such as a methallyl group; alkynyl groups such as a phenylethynyl group; cyclic alkyl groups such as a cyclopropyl group; and aryl groups such as phenyl and benzyl groups. These groups can be suitably used. Further, these alkyl groups, alkenyl groups and alkynyl groups may be linear, cyclic or branched.

Specific examples of the monoamine compound represented by the formula (1) include ammonia, trimethylamine, triethylamine, tri-n-propylamine, triisopropylamine, tricyclopropylamine, tri-n-butylamine, triisobutylamine, tri-t-butylamine, tri-2-methylbutylamine, tri-n-hexylamine, tricyclohexylamine, tri(2-ethylhexyl)amine, trioctylamine, triphenylamine, tribenzylamine, dimethylphenylamine, diethylphenylamine, diisobutylphenylamine, methyldiphenylamine, ethyldiphenylamine, isobutyldiphenylamine, dimethylamine, diethylamine, di-n- propylamine, diisopropylamine, dicyclopropylamine, di-n-butylamine, diisobutylamine, di-t-butylamine, methylethylamine, methylbutylamine, di-n-hexylamine, dicyclohexylamine, di(2-ethylhexyl)amine, dioctylamine, diphenylamine, dibenzylamine, methylphenylamine, ethylphenylamine, isobutylphenylamine, methylmethacrylamine, methyl(phenylethynyl)amine, phenyl(phenylethynyl)amine, methylamine, ethylamine, n-propylamine, isopropylamine, cyclopropylamine, n-butylamine, isobutylamine, t-butylamine, 2-methylbutylamine, n-hexylamine, cyclohexylamine, 2-ethylhexylamine, octylamine, phenylamine, and benzylamine. Specific examples of the polyamine compound include ethylenediamine, N,N'-dimethylethylenediamine, N,N'-diethylethylenediamine, N,N,N',N'-tetramethylethylenediamine, N,N,N',N'-tetraethylethylenediamine, N,N'-diisopropylethylenediamine, N,N'-di-t-butylethylenediamine, N,N'-diphenylethylenediamine, diethylenetriamine, 1,7-dimethyl-1,4,7-triazaheptane, 1,7-diethyl-1,4,7-triazaheptane, triethylenetetramine, phenylenediamine, N,N,N',N'-tetramethyldiaminobenzene, 1-aza-bicyclo[2.2.1]heptane, 1-aza-bicyclo[2.2.2]octane (quinuclidine), 1-azacyclohexane, 1-aza-cyclohexane-3-ene, N-methyl-1-azacyclohexane-3-ene, morpholine, N-methylmorpholine, N-ethylmorpholine, piperazine, and N,N',N"-trimethyl-1,3,5-triaza-cyclohexane. These amine compounds can be used alone or in admixture of two or more.

Although the conductive film forming composition of the present invention comprises a complex of an amine compound and alane, it may further contain an aluminum compound other than the complex of the amine compound and alane. Illustrative examples of the aluminum compound other than the complex which can be contained in the conductive film forming composition of the present invention include trimethylaluminum, triethylaluminum, tri-n-propylaluminum, tricyclopropylaluminum, tri-n-butylaluminum, triisobutylaluminum, tri-t-butylaluminum, tri-2-methylbutylaluminum, tri-n-hexylaluminum, tricyclohexylaluminum, tri(2-ethylhexyl)aluminum, trioctylaluminum, triphenylaluminum, tribenzylaluminum, dimethylphenylaluminum, diethylphenylaluminum, diisobutylphenylaluminum, methyldiphenylaluminum, ethyldiphenylaluminum, isobutyldiphenylaluminum, diethyl aluminum hydride, diisobutyl aluminum hydride, diphenyl aluminum hydride, dimethylmethacrylaluminum, dimethyl(phenylethynyl)aluminum, diphenyl (phenylethynyl)aluminum, dimethylamine.dimethylaluminum complex, diethylamine.diethylaluminum complex, dimethylamine.diethylaluminum complex, diethylamine.dimethylaluminum complex, diphenylamine.dimethylaluminum complex, and diphenylamine.diethylaluminum complex. These aluminum compounds can be used alone or in admixture of two or more.

The complex of an amine compound and alane is dissolved in a solvent and used as a coating solution. The solvent used is not particularly limited and may be any solvent which can dissolve the complex of an amine compound and alane but does not react with the complex. Illustrative examples of the solvent include hydrocarbon-based solvents such as n-pentane, cyclopentane, n-hexane, cyclohexane, n-heptane, cycloheptane, n-octane, cyclooctane, decane, cyclodecane, dicyclopentadiene hydride, benzene, toluene, xylene, durene, indene, tetrahydronaphthalene, decahydronaphthalene, and squalane; ether-based solvents such as diethyl ether, dipropyl ether, dibutyl ether, ethylene glycol dimethyl ether, ethylene glycol diethyl ether, ethylene glycol methylethyl ether, diethylene glycol dimethyl ether, diethylene glycol diethyl ether, diethylene glycol methylethyl ether, tetrahydrofuran, tetrahydropyrane, and p-dioxane; and polar solvents such as methylene chloride, and chloroform. Of these, from the viewpoints of the solubility of the complex of an amine compound and alane and the stability of the solution, the hydrocarbon-based solvent or a mixture of the hydrocarbon-based solvent and the ether-based solvent is preferably used. These solvents can be used alone or in admixture of two or more.

The concentration of the solution of the complex of an amine compound and alane is preferably 0.1 to 50 wt %. The concentration can be adjusted as appropriate according to the thickness of a desired conductive film.

To adjust the conductivity of the solution, fine particles of metal such as gold, silver, copper, aluminum, nickel, iron, niobium, titanium, silicon, indium, and tin and/or a semiconductor may be mixed into the solution of the complex of an amine compound and alane as appropriate prior to use of the composition. Further, if necessary, fine particles of a metal oxide such as aluminum oxide, zirconium oxide, titanium oxide or silicon oxide may also be mixed into the composition prior to its use. In addition, to improve the wettability of the solution against an object to be coated, improve the leveling property of a coating film, and prevent the occurrences of lump and orange peel on the coating film, a surface tension modifier such as a fluorine-based surfactant, a silicone-based surfactant or a nonionic surfactant may be added in such a small amount that does not impair the target effect. Illustrative examples of nonionic surfactants that can be added include a fluorine-based surfactant having a fluoroalkyl group or a perfluoroalkyl group, and a polyether alkyl surfactant having an oxyalkyl group. Specific examples of the above fluorine-based surfactant include $C_9F_{19}CONHC_{12}H_{25}$, $C_8F_{17}SO_2NH-(C_2H_4O)_6H$, $C_9F_{17}O(PLURONIC L-35)C_9F_{17}$, and $C_9F_{17}O(PLURONIC P-84)C_9F_{17}$. PLURONIC L-35 is a polyoxypropylene-polyoxyethylene block copolymer manufactured by ASAHI DENKA CO., LTD. and having an average molecular weight of 1,900; and PLURONIC P-84 is a polyoxypropylene-polyoxyethylene block copolymer manufactured by ASAHI DENKA CO., LTD. and having an average molecular weight of 4,200. Specific examples of these fluorine-based surfactants include EFTOP EF301, EFTOP EF303, and EFTOP EF352 (products of SHIN AKITA KASEI CO., LTD.), MEGAFAC F171 and MEGAFAC F173 (products of DAINIPPON INK AND CHEMICALS, INC.), ASAHI GUARD AG710 (product of ASAHI GLASS COMPANY), FLUORAD FC-170C, FLUORAD FC430 and FLUORAD FC431 (product of Sumitomo 3M), SURFLON S-382, SURFLON SC101, SURFLON SC102, SURFLON SC103, SURFLON SC104, SURFLON SC105 and SURFLON SC106 (products of ASAHI GLASS COMPANY), BM-1000 and BM-1100 (products of B.M-Chemie Co., Ltd.), and Schsego-Fluor (product of Schwegmann Co., Ltd.). Further, illustrative examples of the polyether alkyl surfactant include a polyoxyethylene alkyl ether, a polyoxyethylene allyl ether, a polyoxyethylene alkylphenol ether, a polyoxyethylene fatty acid ester, a sorbitan fatty acid ester, a polyoxyethylene sorbitan fatty acid ester, and an oxyethylene oxypropylene block copolymer. Specific examples of these polyether alkyl surfactants include EMULGEN 105, EMULGEN 430, EMULGEN 810, EMULGEN 920, RHEODOL SP-40S, RHEODOL TW-L120, EMANOL 3199, EMANOL 4110, EXCEL P-40S, BRIDGE 30, BRIDGE 52, BRIDGE 72, BRIDGE 92, ARACEL 20, EMASOL 320, TWIN 20, TWIN 60, and MERGE 45 (products of Kao Corporation), and NONIBAL 55 (product of Sanyo Chemical Industries, Ltd.). Illustrative examples of nonionic surfactants other than those enumerated above include a polyoxyethylene fatty acid ester, a polyoxyethylene sorbitan fatty acid ester, and a polyalkylene oxide block copolymer. Specific examples thereof include CHEMISTAT 2500 (product of Sanyo Chemical Industries, Ltd.), SN-EX9228 (product of SANNOPCO CO., LTD.), and NONAL 530 (product of Toho Chemical Industry Co., Ltd.).

The thus obtained solution composition is applied on a substrate so as to form a coating film comprising the complex of an amine compound and alane. The material and shape of the substrate are not particularly limited. Its material is preferably capable of enduring a subsequent step of heat treatment. The surface of the substrate on which the coating film is formed may be even or uneven, and the shape of the substrate is not particularly limited. Specific examples of the material of the substrate include glass, metal, plastic, and ceramic. As glass, quartz glass, borosilicate glass, soda glass, and lead glass can be used. As metal, gold, silver, copper, nickel, silicon, aluminum, iron, and stainless steel can be used. As plastic, a polyimide and a polyether sulfone can be used. Further, the shapes of these materials may be a bulk, a plate, a film and the like and are not particularly limited. In addition, a method of coating the above solution is not particularly limited, and the solution can be coated by spin coating, dip coating, curtain coating, roller coating, spray coating, ink jet coating, printing or the like. The solution can be coated only once or recoated several times.

Further, in the present invention, the above substrate can be coated in advance with a solution which contains an organometallic compound containing a metal atom selected from the group consisting of Ti, Pd and Al so as to be used as a substrate having a coating film (foundation layer) comprising the organometallic compound. By forming such a foundation layer, adhesion between the substrate and the aluminum film is retained stably.

Illustrative examples of an organometallic compound containing a Ti atom include a titanium alkoxide, a titanium compound containing an amino group, a titanium complex with a β-diketone, a titanium compound containing a cyclopentadienyl group, and a titanium compound containing a halogen group.

Illustrative examples of an organometallic compound containing a Pd atom include a palladium complex having a halogen group, palladium acetates, a palladium complex with a β-diketone, a palladium complex with a compound having a conjugated carbonyl group, a phosphine Pd complex, and the like.

Further, illustrative examples of an organometallic compound containing an Al atom include an aluminum alkoxide, an aluminum alkylate, and an aluminum complex with a β-diketone, excluding an alane-amine complex.

Illustrative examples of the organometallic compounds include titanium alkoxides such as titanium methoxide, titanium ethoxide, titanium-n-propoxide, titanium-n-nonyloxide, titanium stearyloxide, titanium isopropoxide, titanium-n-butoxide, titanium isobutoxide, titanium-t-butoxide, titanium tetrakis(bis-2,2-(allyloxymethyl)butoxide), titanium triisostearoyl isopropoxide, titanium trimethylsiloxide, titanium-2-ethylhexoxide, titanium methacrylate triisopropoxide, (2-methacryloxyethoxy) triisopropoxy titanate, titanium methoxypropoxide, titanium phenoxide, titanium methylphenoxide, poly(dibutyl titanate), poly(octylene glycol titanate), titanium bis(triethanolamine)diisopropoxide, titanium tris (dodecylbenzene sulfonate)isopropoxide, titanium trimethacrylate methoxyethoxyethoxide, titanium tris(dioctyl pyrophosphate)isopropoxide and titanium lactate; titanium compounds having an amino group such as tetrakis (dimethylamino)titanium and tetrakis(diethylamino) titanium; titanium complexes with a β-diketone such as titanium bis(ethylacetoacetate)diisopropoxide, tris(2,2,6,6-tetramethyl-3,5-heptanedionate)titanium, titanium oxide bis (pentanedionate), titanium oxide (tetramethylheptanedionate), titanium methacryloxyacetoacetate triisopropoxide, titanium di-n-butoxide(bis-2,4-pentanedionate), titanium diisopropoxide (bis-2,4-pentanedionate), titanium diisopropoxide bis (tetramethylheptanedionate), titanium diisopropoxide bis (ethylacetoacetate), di(iso-propoxide)bis(2,2,6,6-tetramethyl-3,5-heptane dionate)titanium and titanium allylacetoacetate triisopropoxide; titanium compounds containing a cyclopentadienyl group such as titanocene dichloride, (trimethyl)pentamethylcyclopentadienyl titanium and dimethyl bis(t-butylcyclopentadienyl)titanium; titanium compounds containing a halogen atom such as indenyl titanium trichloride, pentamethylcyclopentadienyl titanium trichloride, pentamethylcyclopentadienyl titanium trimethoxide, trichlorotris(tetrahydrofuran)titanate, tetrachlorobis(tetrahydrofuran)titanium, titanium chloride triisopropoxide, titanium iodide triisopropoxide, titanium dichloride diethoxide, dichlorobis(2,2,6,6-tetramethyl-3,5-heptanediaonate)titanium, tetrachlorobis (cyclohexylmercapto)titanium and titanium chloride; palladium complexes having a halogen atom such as palladium chloride, allyl palladium chloride, dichlorobis(acetonitrile) palladium and dichlorobis(benzonitrile)palladium; acetates such as palladium acetate; palladium complexes with a β-diketone such as palladium 2,4-pentane dionate and palladium hexafluoropentane dionate; palladium complexes with a compound having a conjugated carbonyl group such as bis(dibenzylideneacetone)palladium; phosphine-based Pd complexes such as bis[1,2-bis(diphenylphosphino)ethane] palladium, bis(triphenylphosphine)palladium chloride, bis (triphenylphosphine)palladium acetate, diacetate bis (triphenylphosphine)palladium, dichloro[1,2-bis (diphenylphosphine)ethane]palladium, trans-dichlorobis (tricyclohexylphosphine)palladium, trans-dichlorobis (triphenylphosphine)palladium, trans-dichlorobis(tri-o-tolylphosphine)palladium and tetrakis(triphenylphosphine) palladium; aluminum alkoxides such as aluminum ethoxide, aluminum isopropoxide, aluminum-n-butoxide, aluminum-s-butoxide, aluminum-t-butoxide, aluminum ethoxyethoxyethoxide, aluminum phenoxide and aluminum lactate; aluminum alkylates such as aluminum acetate, aluminum acrylate, aluminum methacrylate, and aluminum cyclohexane butyrate; and aluminum complexes with a β-diketone such as aluminum-2,4-pentane dionate, aluminum hexafluoropentane dionate, aluminum-2,2,6,6-tetramethyl-3,5-heptane dionate, aluminum-s-butoxide bis (ethylacetoacetate), aluminum di-s-butoxide ethylacetoacetate, aluminum diisopropoxide ethylacetoacetate.

Of these, titanium isopropoxide, aluminum isopropoxide, titanium bis(ethylacetoacetate)diisopropoxide, palladium-2,4-pentane dionate, palladium hexafluoropentane dionate, aluminum-2,4-pentane dionate and aluminum hexafluoropentane dionate are preferably used.

As a solvent used in the solution of the organometallic compound containing a metal atom selected from the group consisting of Ti, Pd and Al, any solvent can be used as long as the solvent can dissolve the organometallic compound alone or as a mixture with water. As the solvent, there can be used, for example, water, ethers such as tetrahydrofuran, dioxane, ethylene glycol dimethyl ether, ethylene glycol diethyl ether, diethylene glycol dimethyl ether and diethylene glycol diethyl ether, alcohols such as methanol, ethanol and propanol, and aprotic polar solvents such as N-methylpyrrolidone, N,N-dimethylformamide, N,N-dimethylacetoamide, hexamethylphosphoamide and γ-butyrolactone. These solvents can be used alone or as a mixture with water.

The solutions of these organometallic compounds can be coated on a substrate by the same coating methods as those used to coat the solution of alane and an amine compound. The thickness of the coating film (foundation layer) after removal of the solvent is preferably 0.001 to 10 $\mu$m, more preferably 0.005 to 1 $\mu$m. When the thickness is too large, the flatness of the film is difficult to obtain, while when the thickness is too small, the foundation layer may have poor adhesion to the substrate or the film in contact with the layer. The foundation layer is formed by coating the above solution and then drying the coated solution so as to remove the solvent.

The substrate used in the present invention can also be used as a substrate having both a hydrophobic portion and a hydrophilic portion thereon. Thereby, it also becomes possible to form a conductive film only in a specific portion on the substrate.

The hydrophobic portion of the substrate having the hydrophobic portion and a hydrophilic portion thereon used in the present invention is formed by applying hexamethyldisilazane or a solution containing the above fluorine-based surfactant or the like to a portion where the hydrophobic portion is to be formed and then baking the coated substrate at 100 to 500° C. To apply hexamethyldisilazane or the solution containing the above fluorine-based surfactant only to the target portion, the whole surface of the substrate is treated in a manner described later so as to be rendered hydrophilic in advance, a portion of the hydrophilic surface which is required to be left hydrophilic is covered, and then the target hydrophilic portion is treated to be rendered hydrophobic. A method of covering the hydrophilic portion is not particularly limited. For example, a method can be used which comprises the steps of covering the portion to be left hydrophilic with a known resist by carrying out patterning in accordance with a known photolithography process or with a masking tape, forming the conductive film of the present invention in the target portion, and then removing the resist or masking tape used by a known method. Further, it is also possible that the whole surface of the substrate is treated by a similar method so as to be rendered hydrophobic and then a specific portion is treated to be rendered hydrophilic.

Further, the hydrophilic portion of the substrate having the hydrophobic portion and the hydrophilic portion thereon used in the present invention can be obtained by applying a solution containing an organometallic compound containing a metal atom selected from the group consisting of Ti, Pd and Al to a portion where the hydrophilic portion is to be formed on the substrate and then drying the applied solution.

As the organometallic compound, the same organometallic compounds as described above with respect to the foundation layer can be preferably used.

In the method of the present invention, a coating film of a solution using a complex of an amine compound and alane is heat-treated and/or irradiated with light to be converted into a conductive film. The heat treatment temperature is preferably not lower than 100° C., more preferably 150 to 500° C. A heat treatment time of 30 seconds to about 120 minutes is sufficient. Further, the heat treatment is preferably carried out in a baking atmosphere containing hydrogen and as little oxygen as possible since a conductive film of good quality can be obtained. Hydrogen in the above baking atmosphere can also be used as a mixed gas with, for example, nitrogen, helium or argon. Further, it is also possible to form a conductive film by irradiating a coating film of a solution using a complex of an amine compound and alane with light. For irradiation with light, a low-pressure or high-pressure mercury lamp, a deuterium lamp, discharge light of a noble gas such as argon, krypton or xenon, a YAG laser, an argon laser, a carbon dioxide laser or an excimer laser such as XeF, XeCl, XeBr, KrF, KrCl, ArF or ArCl or the like can be used as a light source. Although as these light sources, those having a power of 10 to 5,000 W are generally used, a power of 100 to 1,000 W is usually sufficient. Although the wavelengths of these light sources are not particularly limited, they are normally 170 to 600 nm. Further, from the viewpoint of an effect of modifying the conductive film, use of laser light is particularly preferred. The temperature at the time of irradiation of light generally ranges from room temperature to 200° C. Further, irradiation of light may be carried out via a mask so as to irradiate only a specific site with light. Although a suitable thickness of the conductive film varies depending on a coating method used and a solid content, the film thickness is preferably 0.01 to 100 $\mu$m, more preferably 0.05 to 10 $\mu$m. When the thickness is too large, the flatness of the conductive film is difficult to obtain, while when the thickness is too small, the conductive film may have poor adhesion to a substrate or a film in contact with the conductive film.

When the thus obtained conductive film is left to stand in the air, it is oxidized easily, and an aluminum oxide layer is formed on the surface. This may become a problem when it is used in, e.g., wiring and/or an electrode. To prevent the oxidization, it is preferable to form a protective film under an inert gas atmosphere after formation of the conductive film under an inert gas atmosphere. As the protective film, (i) a metal film selected from the group consisting of Ti, Pd and Al or (ii) an organic polymer film is preferably used, for example.

The above metal film can be formed by applying a solution of the same organometallic compound as used for forming the foundation layer and then heating the applied solution and/or irradiating the applied solution with light so as to convert the organometallic compound into a corresponding metal. Heating and/or irradiation with light can be performed under the same conditions as described above.

Meanwhile, the organic polymer film can be formed by applying a solution of an organic polymer and then drying the applied solution at, for example, 50 to 200° C. so as to remove a solvent. The polymer used in the solution is not particularly limited. For example, there can be used homopolymers exemplified by polyalkyl(meth)acrylates such as a polymethyl methacrylate, a polybutyl methacrylate and a polyethyl acrylate, a polystyrene, a polybutene, a polyvinyl alcohol, a polyvinyl acetate and a polybutadiene and copolymers of these polymers can be used. As solvents used in solutions of these polymers, any solvents which dissolve these polymers can be used.

The thickness of the protective film after removal of a solvent is preferably 0.001 to 10 $\mu$m, more preferably 0.01 to 1 $\mu$m. When the thickness is too large, the flatness of the protective film is difficult to obtain, while when it is too small, the protective film may have poor adhesion to a substrate or the film in contact with the protective film.

EXAMPLES

Hereinafter, the present invention will be further described with reference to Examples. However, the present invention shall not be limited to these Examples.

An alane-amine complex used in the following Examples was synthesized in the following manner.

In a solution containing 20 g of triethylamine in ethyl ether (100 ml), fivefold moles of hydrogen chloride gas was bubbled to cause a reaction. Then, a precipitated salt was filtered off with a filter, washed with 100 ml of ethyl ether, and dried to synthesize 24 g of triethylamine hydrochloride. 14 g of the obtained triethylamine hydrochloride was dissolved in 500 ml of tetrahydrofuran, the resulting solution was added dropwise to a suspension comprising 3.8 g of lithium aluminum hydride and 500 ml of ethyl ether at room temperature under nitrogen in one hour, and after completion of the dropwise addition, the resulting mixture was allowed to further react at room temperature for 6 hours. The reaction solution was filtered with a 0.2-$\mu$m membrane filter, the filtrate was concentrated under nitrogen, and a salt precipitated during concentration was filtered off with a 0.2-$\mu$m membrane filter. Further, after addition of 300 ml of toluene, the solvent was scattered under nitrogen so as to concentrate the solution. A salt precipitated during concentration was filtered with a 0.2-$\mu$m membrane filter again for purification so as to obtain a 10% toluene solution of a reaction product.

Figure 2:
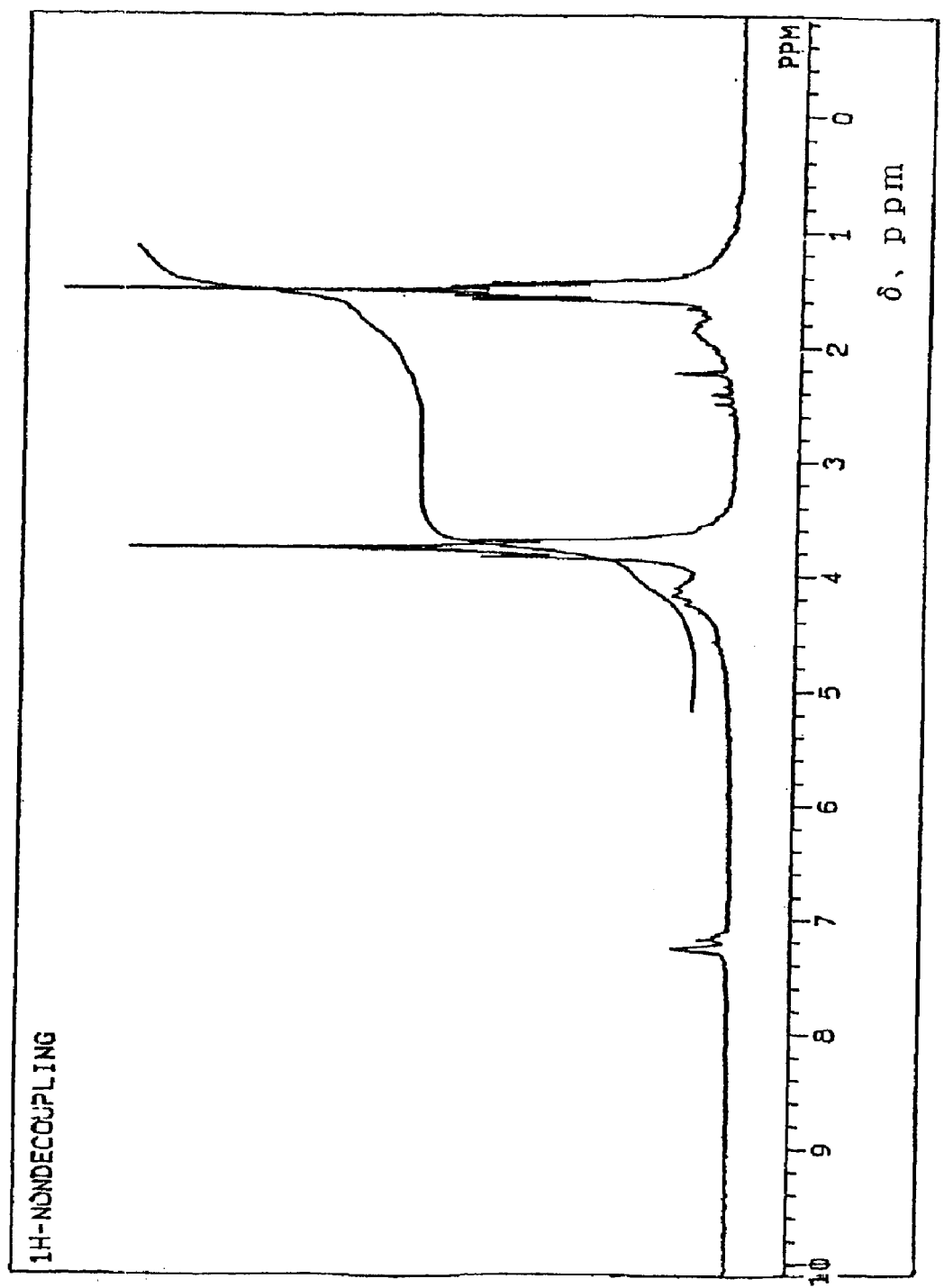
FIG. 2 is a diagram of an NMR spectrum of an alane-amine complex used in Examples.

An IR spectrum of a sample obtained by applying the obtained 10% toluene solution of the reaction product on KBr and evaporating the solvent under nitrogen is shown in FIG. 1. The IR spectrum in FIG. 1 shows absorptions of $\nu$(Al—H) at 1,710 cm$^{-1}$, $\nu$(Al≡H$_3$) and $\nu$(N—Al—H) at 760 cm$^{-1}$, and $\nu$(N—Al—N) at 470 cm$^{-1}$, indicating that the obtained reaction product was a triethylamine-alane complex. Further, an NMR spectrum (measurement solvent: deuterium benzene (C$_6$D$_6$), FIG. 2) of the reaction product shows absorptions of protons of AlH$_3$ at 4.1 ppm and protons of methyl and methylene in a C$_2$H$_5$N group at 1.5 and 3.8 ppm, indicating that the obtained reaction product was a triethylamine-alane complex.

Example 1

A glass substrate was immersed in a 1% toluene solution of titanium bis(ethylacetoacetate)diisopropoxide for 1 hour and then dried at 100° C. for 30 minutes and then at 300° C. for 30 minutes so as to prepare a hydrophilic substrate. On the glass substrate, a solution prepared by dissolving 10 g of triethylamine-alane complex in a mixed solvent comprising 45 g of toluene and 45 g of tetrahydrofuran in a nitrogen atmosphere was spin-coated at 1,000 rpm, and the coated substrate was immediately prebaked at 110° C. so as to remove the solvents, thereby forming a film composed essentially of the triethylamine-alane complex. When the coating film was further heated at 250° C. for 30 minutes and then at 350° C. for 30 minutes in a nitrogen atmosphere so as to thermally decompose the film, a film having a metallic luster was formed on the glass substrate. When the thickness of the film on the substrate was measured by use of $\alpha$-step (product of Tenchor Co., Ltd.), it was 100 nm. When the ESCA of the film was measured, a peak attributed to aluminum in Al$_{2p}$ was observed at 73.5 eV. Further, when the conductivity of the film was examined, the film was found to be a conductive film showing a sheet resistance value of 100 $\mu\Omega\square$ and a resistance value of 30 $\mu\Omega\cdot$cm.

Example 2

Using the same hydrophilic glass substrate as used in Example 1, a baked film was prepared in the same manner as in Example 1 except that 10 g of ammonia-alane complex was used in place of 10 g of the triethylamine-alane complex. When the thickness of the film on the substrate was measured by use of $\alpha$-step (product of Tenchor Co., Ltd.), it was 90 nm. Further, when the conductivity of the film was examined, the film was found to be a conductive film showing a sheet resistance value of 120 $\mu\Omega\square$.

Example 3

Using the same hydrophilic glass substrate as used in Example 1, a baked film was prepared in the same manner as in Example 1 except that 10 g of phenyldimethylamine-alane complex was used in place of 10 g of the triethylamine-alane complex. When the thickness of the film on the substrate was measured by use of $\alpha$-step (product of Tenchor Co., Ltd.), it was 85 nm. Further, when the conductivity of the film was examined, the film was found to be a conductive film showing a sheet resistance value of 95 $\mu\Omega\square$.

Example 4

Using the same hydrophilic glass substrate as used in Example 1, a baked film was prepared in the same manner as in Example 1 except that 10 g of triisobutylamine-alane complex was used in place of 10 g of the triethylamine-alane complex. When the thickness of the film on the substrate was measured by use of $\alpha$-step (product of Tenchor Co., Ltd.), it was 75 nm. Further, when the conductivity of the film was examined, the film was found to be a conductive film showing a sheet resistance value of 125 $\mu\Omega\square$.

Example 5

Using the same hydrophilic glass substrate as used in Example 1, a baked film was prepared in the same manner as in Example 1 except that 10 g of diisopropylamine-alane complex was used in place of 10 g of the triethylamine-alane complex. When the thickness of the film on the substrate was measured by use of $\alpha$-step (product of Tenchor Co., Ltd.), it was 95 nm. Further, when the conductivity of the film was examined, the film was found to be a conductive film showing a sheet resistance value of 130 $\mu\Omega\square$.

Example 6

Using the same hydrophilic glass substrate as used in Example 1, a baked film was prepared in the same manner as in Example 1 except that 10 g of triisopropylamine-alane complex was used in place of 10 g of the triethylamine-alane complex. When the thickness of the film on the substrate was measured by use of $\alpha$-step (product of Tenchor Co., Ltd.), it was 85 nm. Further, when the conductivity of the film was examined, the film was found to be a conductive film showing a sheet resistance value of 95 $\mu\Omega\square$.

Example 7

Using the same hydrophilic glass substrate as used in Example 1, a baked film was prepared in the same manner as in Example 1 except that 10 g of triphenylamine-alane complex was used in place of 10 g of the triethylamine-alane complex. When the thickness of the film on the substrate was measured by use of $\alpha$-step (product of Tenchor Co., Ltd.), it was 85 nm. Further, when the conductivity of the film was examined, the film was found to be a conductive film showing a sheet resistance value of 110 $\mu\Omega\square$.

Example 8

A glass substrate was immersed in a 1% toluene solution of titanium bis(ethylacetoacetate)diisopropoxide for 1 hour and then dried at 100° C. for 30 minutes and then at 300° C. for 30 minutes so as to form a hydrophilic titanium-containing foundation layer. On the substrate, a solution prepared by dissolving 10 g of triethylamine-alane complex in 90 g of toluene in a nitrogen atmosphere was spin-coated at 1,000 rpm, and the coated substrate was immediately prebaked at 110° C. for 15 minutes so as to remove the solvent, thereby forming a film composed essentially of the triethylamine-alane complex. When the coating film was further heated at 250° C. for 30 minutes and then at 350° C. for 30 minutes in a nitrogen atmosphere so as to thermally decompose the film, a film having a metallic luster was formed on the glass substrate. When the thickness of the film on the substrate was measured by use of α-step (product of Tenchor Co., Ltd.), it was 300 nm. When the ESCA of the film was measured, a peak attributed to aluminum in $Al_{2p}$ was observed at 73.5 eV. Further, when the conductivity of the film was examined, the film was found to be a conductive film showing a sheet resistance value of 100 $\mu\Omega\square$ and a resistance value of 30 $\mu\Omega\cdot cm$. Then, on the aluminum film, a 5% toluene solution of titanium bis(ethylacetoacetate) diisopropoxide was spin-coated, and the resulting substrate was baked at 350° C. for 1 hour so as to form a protective layer having a thickness of 50 nm. Thereby, a conductive film having a three-layer structure comprising the foundation layer, the aluminum layer and the top layer (protective layer) was formed. When the conductivity of the conductive film having the three-layer structure was examined, the film was found to be a three-layer conductive film showing a resistance value of 45 $\mu\Omega\cdot cm$.

Example 9

A titanium-containing foundation layer and a conductive aluminum layer were formed on a glass substrate in the same manner as in Example 8. Then, on the aluminum film, a 3% THF solution of palladium hexafluoropentane dionate was spin-coated, and the resulting substrate was baked at 350° C. for 1 hour so as to form a protective layer having a thickness of 30 nm. Thereby, a conductive film having a three-layer structure comprising the foundation layer, the aluminum layer and the top layer (protective layer) was formed. When the conductivity of the conductive film having the three-layer structure was examined, the film was found to be a three-layer conductive film showing a sheet resistance value of 50 $\mu\Omega\cdot cm$.

Example 10

A titanium-containing foundation layer and a conductive aluminum layer were formed on a glass substrate in the same manner as in Example 8. Then, on the aluminum film, a 3% THF solution of aluminum-n-butoxide was spin-coated, and the resulting substrate was baked at 350° C. for 1 hour so as to form a protective layer having a thickness of 35 nm. Thereby, a conductive film having a three-layer structure comprising the foundation layer, the aluminum layer and the top layer (protective layer) was formed. When the conductivity of the conductive film having the three-layer structure was examined, the film was found to be a three-layer conductive film showing a sheet resistance value of 45 $\mu\Omega\cdot cm$.

Comparative Example 1

The same substrate as used in Example 1 was treated in the same manner as in Example 1 by use of an isopropyl alcohol solution having 10% of aluminum isopropoxide dissolved therein in place of the triethylamine-alane complex used in Example 1. A conductive film could not be formed.

As described in detail above, according to the present invention, there is provided an industrial method of forming a conductive film easily. This method is different from a conventional method of forming a conductive aluminum film by a vacuum process such as sputtering, vacuum deposition or chemical vapor deposition in that it comprises the steps of coating a complex of an amine which is a specific nitrogen-containing compound and alane on a substrate which has been subjected to a special treatment by a solution coating method such as spin coating or ink jet coating so as to form a coating film and then subjecting the coating film to a heat treatment and/or irradiation with light so as to form the conductive film. Further, unlike a conventional CVD process which comprises deposition from a gas phase, a precursor film formed by a coating method is subjected to a heat treatment and/or irradiation with light, whereby a conductive film which is inexpensive and uniform and dense in texture and wiring or/and an electrode using the conductive film can be formed.

What is claimed is:

1. A method for forming a conductive film, which method comprising the steps of applying a conductive film forming composition comprising a complex of an amine compound and aluminum hydride and an organic solvent on a substrate and then subjecting the applied composition to heating and/or irradiation with light so as to form an aluminum film, wherein the substrate has a coating film which comprises an organometallic compound containing a metal atom selected from the group consisting of Ti, Pd and Al, and the conductive film forming composition is applied on the coating film on the substrate.

2. The method of claim 1, which further comprises the steps of forming a coating film which comprises an organometallic compound containing a metal atom selected from the group consisting of Ti, Pd and Al on the aluminum film and then subjecting the formed coating film to heating and/or irradiation with light so as to convert the coating film into a corresponding metal film.

3. A method for forming a patterned conductive film, which method comprising the steps of applying a conductive film forming composition comprising a complex of an amine compound and aluminum hydride and an organic solvent on a substrate having hydrophilic portions and hydrophobic portions patterned on the surface so as to form a patterned coating film and then subjecting the coating film to heating and/or irradiation with light so as to form a patterned aluminum film.

4. The method of claim 3, which further comprises the steps of forming a coating film which comprises an organometallic compound containing a metal atom selected from the group consisting of Ti, Pd and Al on the patterned aluminum film and then subjecting the coating film to heating and/or irradiation with light so as to convert the coating film into a corresponding metal film.

* * * * *